(12) United States Patent
Aschieri

(10) Patent No.: US 11,523,214 B2
(45) Date of Patent: Dec. 6, 2022

(54) TRANSDUCER SYSTEM WITH THREE DECIBEL FEEDBACK LOOP

(71) Applicant: Qualcomm Technologies Inc., San Diego, CA (US)

(72) Inventor: Julian Aschieri, Sharon, MA (US)

(73) Assignee: QUALCOMM TECHNOLOGIES INC., San Diego, CA (US)

( * ) Notice: Subject to any disclaimer, the term of this patent is extended or adjusted under 35 U.S.C. 154(b) by 0 days.

(21) Appl. No.: 17/318,980

(22) Filed: May 12, 2021

(65) Prior Publication Data

US 2021/0360347 A1 Nov. 18, 2021

Related U.S. Application Data

(60) Provisional application No. 63/023,562, filed on May 12, 2020.

(51) Int. Cl.

| | |
|---|---|
| *H04R 3/00* | (2006.01) |
| *H03F 3/181* | (2006.01) |
| *H04R 3/02* | (2006.01) |
| *H03F 3/183* | (2006.01) |
| *H04R 3/04* | (2006.01) |
| *H04R 17/02* | (2006.01) |
| *H04R 19/04* | (2006.01) |

(52) U.S. Cl.
CPC ............... *H04R 3/02* (2013.01); *H03F 3/183* (2013.01); *H04R 3/04* (2013.01); *H03F 2200/03* (2013.01); *H04R 17/02* (2013.01); *H04R 19/04* (2013.01); *H04R 2201/003* (2013.01)

(58) Field of Classification Search
CPC . H04R 3/00; H04R 3/002; H04R 3/02; H04R 3/04; H04R 3/06; H04R 17/02; H04R 19/04; H04R 2201/003; H03F 3/181; H03F 3/183; H03F 3/187; H03F 3/45; H03F 1/34; H03F 1/38; H03F 2200/03
See application file for complete search history.

(56) References Cited

U.S. PATENT DOCUMENTS

| | | |
|---|---|---|
| 2,652,458 A | 9/1953 | Miller |
| 2009/0001853 A1 | 1/2009 | Adachi et al. |
| (Continued) | | |

OTHER PUBLICATIONS

International Search Report and Written Opinion of the International Searching Authority for Application No. PCT/US2021/032081, dated Sep. 1, 2021 (12 pages).

*Primary Examiner* — Thang V Tran
(74) *Attorney, Agent, or Firm* — Polsinelli

(57) ABSTRACT

A transducer system has a transducer configured to receive an incident signal and produce an output signal as a function of the incident signal. As known in the art, the output signal has a −3 dB point. The transducer system also has circuitry operatively coupled with the transducer. The circuitry includes an amplifier with an output configured to produce an amplified signal as a function of the output signal. In addition, the circuitry further has a positive feedback loop and a negative feedback loop that both are electrically coupled between the transducer and the amplifier. The positive feedback loop is configured to move the −3 dB point in a first frequency direction. Conversely, the negative feedback loop is configured to move the −3 dB point in a second frequency direction. Preferably, the first and second frequency directions are different.

20 Claims, 9 Drawing Sheets

(56) References Cited

U.S. PATENT DOCUMENTS

| | | | |
|---|---|---|---|
| 2013/0279717 A1* | 10/2013 | Reimann | G01L 9/12 |
| | | | 381/93 |
| 2015/0137834 A1* | 5/2015 | Steiner | H04R 19/04 |
| | | | 324/686 |
| 2018/0139536 A1* | 5/2018 | Nicollini | H04R 19/005 |
| 2018/0234763 A1 | 8/2018 | Ganta et al. | |
| 2019/0212358 A1* | 7/2019 | Oshima | G01P 15/131 |
| 2020/0072865 A1* | 3/2020 | Oshima | G01P 15/125 |
| 2020/0328758 A1* | 10/2020 | Steiner | H04R 19/005 |

* cited by examiner

TRANSDUCER SYSTEM WITH THREE DECIBEL FEEDBACK LOOP

RELATED APPLICATIONS

This application claims priority to U.S. Provisional Application No. 63/023,562, filed May 12, 2020 and titled "Transducer System with Three Decibel Feedback Loop" and naming Julian Aschieri as inventors.

The disclosure of the foregoing is incorporated herein by reference, in its entirety.

FIELD OF THE INVENTION

Illustrative embodiments of the generally relate to transducers and, more particularly, various embodiments of the invention relate to controlling the 3 decibel point of signals produced by transducers.

BACKGROUND OF THE INVENTION

A micro-electro-mechanical system (MEMS) acoustic transducer/sensor coverts acoustic energy into electrical signal, and/or converts an electrical signal into acoustic energy. An example of a MEMS acoustic transducer is a MEMS microphone, which converts sound pressure into an electrical voltage. Based on their transduction mechanisms, MEMS microphones can be made in various forms, such as capacitive microphones or piezoelectric microphones.

MEMS capacitive microphones and electret condenser microphones (ECMs) currently dominate the consumer electronics. Piezoelectric MEMS microphones, however, occupy a growing portion of the consumer market, and have unique advantages compared to their capacitive counterparts. Among other things, piezoelectric MEMS microphones do not have a back plate, eliminating the squeeze film damping, which is an intrinsic noise source for capacitive MEMS microphones. In addition, piezoelectric MEMS microphones are reflow-compatible and can be mounted to a printed circuit board (PCB) using typical lead-free solder processing, which could irreparably damage typical ECMs.

Despite careful fabrication techniques, certain parameters of MEMS microphones are difficult to control. For example, the 3-dB point of the MEMS transducers from the same wafer can vary widely.

SUMMARY OF VARIOUS EMBODIMENTS

In one embodiment, a transducer system includes a first transducer having a transducer output, the first transducer configured to receive an incident signal and produce at the transducer output a first output signal as a function of the incident signal. The first transducer has a first −3 dB point.

The system also includes circuitry operatively coupled with the first transducer, the circuitry including an amplifier having an amplifier input in electrical communication with the transducer output, and an amplifier output, wherein the amplifier is configured to produce an amplified signal as a function of the first output signal. In illustrative embodiments, the amplifier is configured as a linear amplifier. In illustrated embodiments, the transducer system also includes amplifier feedback circuitry operably coupled between the amplifier output and amplifier input to provide a direct feedback signal from the amplifier output and amplifier input, the direct feedback signal not passing through the transducer.

The circuitry also has a first positive feedback loop, the first positive feedback loop electrically coupled to the amplifier output and to the first transducer, to provide a first positive feedback signal to the first transducer; the first positive feedback loop configured to move the first −3 dB point in a first frequency direction. In illustrative embodiments, the first frequency direction is a direction that moves the first −3 dB point lower in frequency.

In illustrative embodiments, the transducer is electrically disposed between the amplifier output and an amplifier input, such that the transducer is an electrical component within the feedback loop.

In some embodiments, the transducer system also includes a first negative feedback loop electrically coupled to the amplifier output and to the first transducer, to provide a negative feedback signal to the first transducer, wherein the first negative feedback loop configured to move the −3 dB point in a second frequency direction (the first and second frequency directions being different). In illustrative embodiments, the second frequency direction is a direction that moves the first −3 dB point higher in frequency.

Illustrative embodiments of the transducer system of claim 1, also include a low-pass filter in electrical communication with the positive feedback loop to filter some frequencies from being provided as feedback voltage to the transducer.

In illustrative embodiments, the first positive feedback loop includes a first programmable impedance, the first programmable impedance configured to controllably assume a plurality of impedance values to adjust an amplitude of the first positive feedback provided to the first transducer. For example, in some embodiments, the first programmable impedance includes a plurality of resistors and a plurality of switches, each resistor of the plurality of resistors coupled to a corresponding switch, and the transducer system further includes a programmable controller configured to provide a corresponding control signal to each switch of the plurality of switches.

In some embodiments, the amplifier is configured as a linear amplifier, and the transducer system further includes a second transducer distinct from the first transducer and configured to receive the incident signal. The second transducer is operably coupled to the amplifier input. In such embodiments, second transducer has a second −3 dB point. In such embodiments, the circuitry also includes a second positive feedback loop, the second positive feedback loop electrically coupled to the amplifier output and to the second transducer, to provide a second positive feedback signal from the amplifier output to the second transducer, the second positive feedback loop configured to move the second −3 dB point in the first frequency direction.

Another embodiment includes a method that includes receiving a transducer signal from a micromachined transducer, the transducer signal having a −3 dB point at a given frequency. The method also includes amplifying the transducer signal to produce an amplified signal, and forming a feedback signal from the amplified signal. The method also includes forwarding the feedback signal to the micromachined transducer, the micromachined transducer, in response to receipt of the feedback signal, moving the −3 dB point to a prescribed frequency range.

In some embodiments, forming the feedback signal includes forming a positive feedback signal, and forwarding the positive feedback signal to the micromachined transducer moves the −3 dB point in a lower frequency direction.

In some embodiments, forming the feedback signal includes forming a positive feedback signal and a negative feedback signal, and forwarding includes forwarding both the positive and negative feedback signals to the transducer. In illustrative embodiments, forming a positive feedback signal and a negative feedback signal also includes summing the positive feedback signal with the negative feedback signal to form a combined feedback signal, and forwarding includes forwarding the combined feedback signal to the transducer.

In illustrative embodiments, the positive feedback signal moves the −3 dB point in a lower frequency direction, the negative feedback signal moves the −3 dB point in a higher frequency direction by a different amount.

In accordance with another embodiment of the invention, a transducer system has a transducer configured to receive an incident signal and produce an output signal as a function of the incident signal. As known in the art, the output signal has a −3 dB point. The transducer system also has circuitry operatively coupled with the transducer. The circuitry includes an amplifier with an output configured to produce an amplified signal as a function of the transducer's output signal. In addition, the circuitry further has a positive feedback loop and a negative feedback loop that both are electrically coupled between the transducer and the amplifier. The positive feedback loop is configured to move the −3 dB point in a first frequency direction. Conversely, the negative feedback loop is configured to move the −3 dB point in a second frequency direction. Preferably, the first and second frequency directions are different.

Among other things, the circuitry further may include a low pass filter configured to filter the amplified signal.

In preferred embodiments, the transducer is a MEMS microphone (e.g., a piezoelectric MEMS microphone). To control the output signal, the positive feedback loop includes a positive prescribed resistance (e.g., one or more resistors) configured to reduce the −3 dB point. In a similar manner, the negative feedback loop may have a negative prescribed resistance (e.g., one or more resistors) configured to increase the −3 dB point. Moreover, one or both the positive and negative feedback loops each may include two loops.

In preferred embodiments, the first frequency direction reduces the frequency of the −3 dB point and the second frequency direction increases the frequency of the −3 dB point. Additionally, the amplifier may produce the amplified signal as a function of the first feedback loop, the second feedback loop, or both the first and second feedback loops.

Among other types, the amplifier may include an analog front-end ("AFE"). Moreover, the transducer may be formed as a transducer integrated circuit die.

In accordance with another embodiment, a method receives a transducer signal from a transducer integrated circuit die. As with other types of such signals, the transducer signal has a −3 dB point. The method then amplifies the transducer signal to produce an amplified signal, forms a feedback signal from the amplified signal, and forwards the feedback signal to the transducer integrated circuit die. In response to receipt of the feedback signal, the transducer moves the −3 dB point to a prescribed frequency range.

The method may form the feedback signal by forming a positive feedback signal and a negative feedback signal (e.g., both signals 180 degrees out of phase with each other). In that case, the method forwards both the positive and negative feedback signals. Preferably, the positive feedback signal moves the −3 dB point in a lower frequency direction, while the negative feedback signal moves the −3 dB point in a higher frequency direction, by a different amount, to the prescribed frequency range.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments enable transducer chips to more efficiently and effectively meet specifications for the −3 dB point (or equivalent point) of a wide variety of underlying systems. To that end, transducer systems are configured with circuitry that uses one or both positive and negative feedback circuitry to control the frequency of the −3 dB point of the transducer. Details of illustrative embodiments are discussed below.

Figure 1:
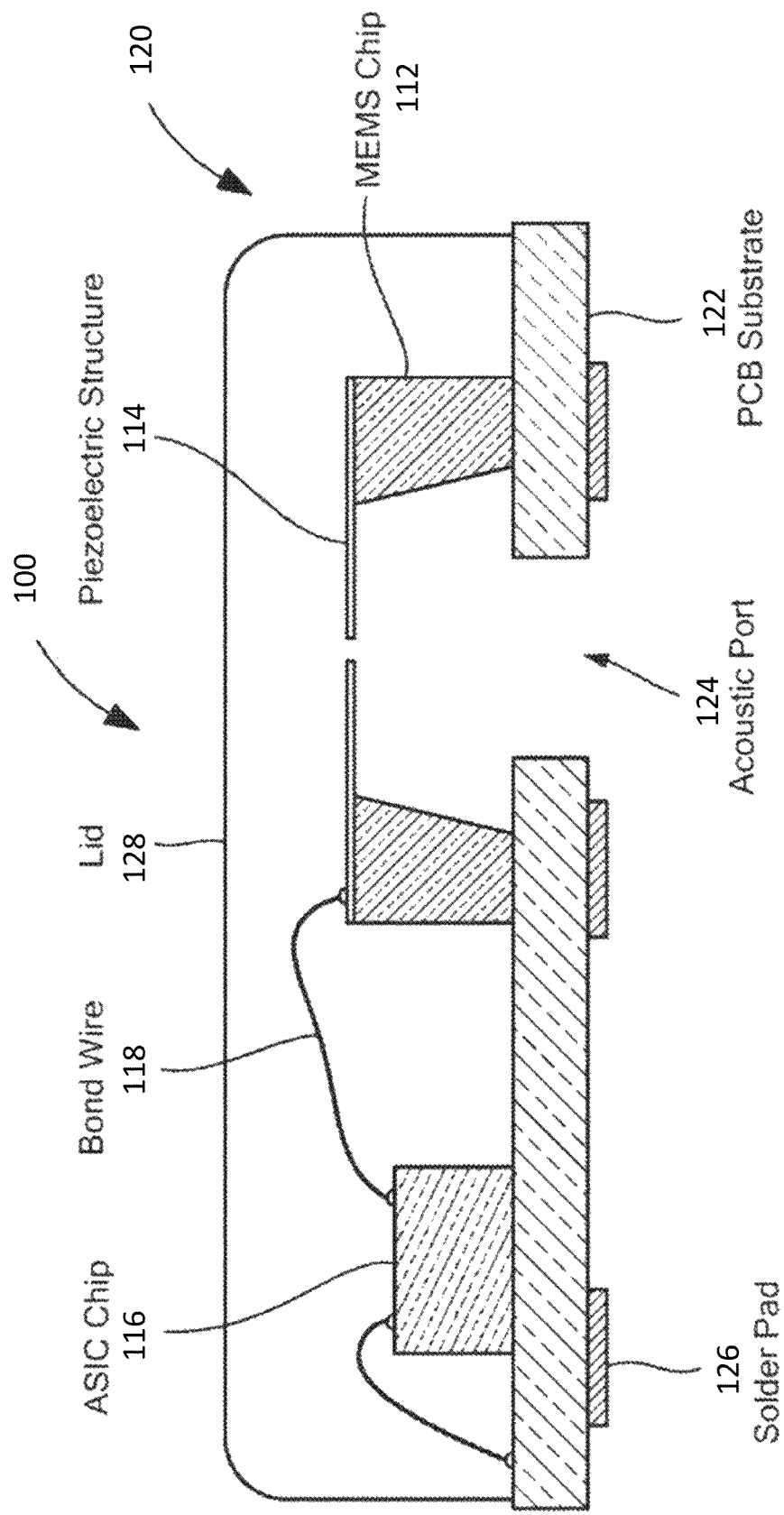
FIG. 1 schematically shows a cross-sectional view of a MEMS acoustic sensor that may implement illustrative embodiments of the invention.

FIG. 1 schematically shows a cross-sectional view of an acoustic sensor implemented as a typical piezoelectric MEMS microphone 100 (also referred to as a "MEMS transducer 100"). As shown, the MEMS microphone 100 of FIG. 1 includes a MEMS chip 112/die having piezoelectric structures 114, e.g. cantilevers or diaphragms, to convert sound pressure into electrical signal, and an application-specific integrated circuit chip/die ("ASIC 116") to buffer and amplify the electrical signal generated by the MEMS chip 112. The MEMS and ASIC chips 112 and 116 are electrically connected by wire bonding 118, and mounted within the interior chamber of a package 120. Specifically, the package 120 has a substrate 122 (e.g., a printed circuit board) that forms an acoustic port 124 for enabling sound pressure to access the MEMS chip 112, and multiple solder pads 126 for users to solder the microphone package 120 onto their boards. A metal lid 128 is typically used to form the housing of the microphone and to mitigate electromagnetic interference (EMI).

As noted, the MEMS chip 112 may be formed from one or more piezoelectric cantilevers or diaphragms (discussed below). Cantilever based piezoelectric structure 114 is preferable in many cases as it typically is stress free after the die is released during fabrication. On the other hand, the diaphragm structure of such a microphone chip 112 typically requires more stress control in the fabrication process as minimal residual stress within the diaphragm can result in significant sensitivity degradation. Multiple cantilevers can be arranged to form a piezoelectric sensing structure, e.g., a square shape, a hexagon shape, an octagon shape, or some other shape.

Rather than implement the system with two separate chips, some embodiments may implement both the MEMS chip 112 and ASIC 116 of this and other embodiments as part of the same die. Accordingly, discussion of separate chips is for illustrative purposes.

Figure 2A:
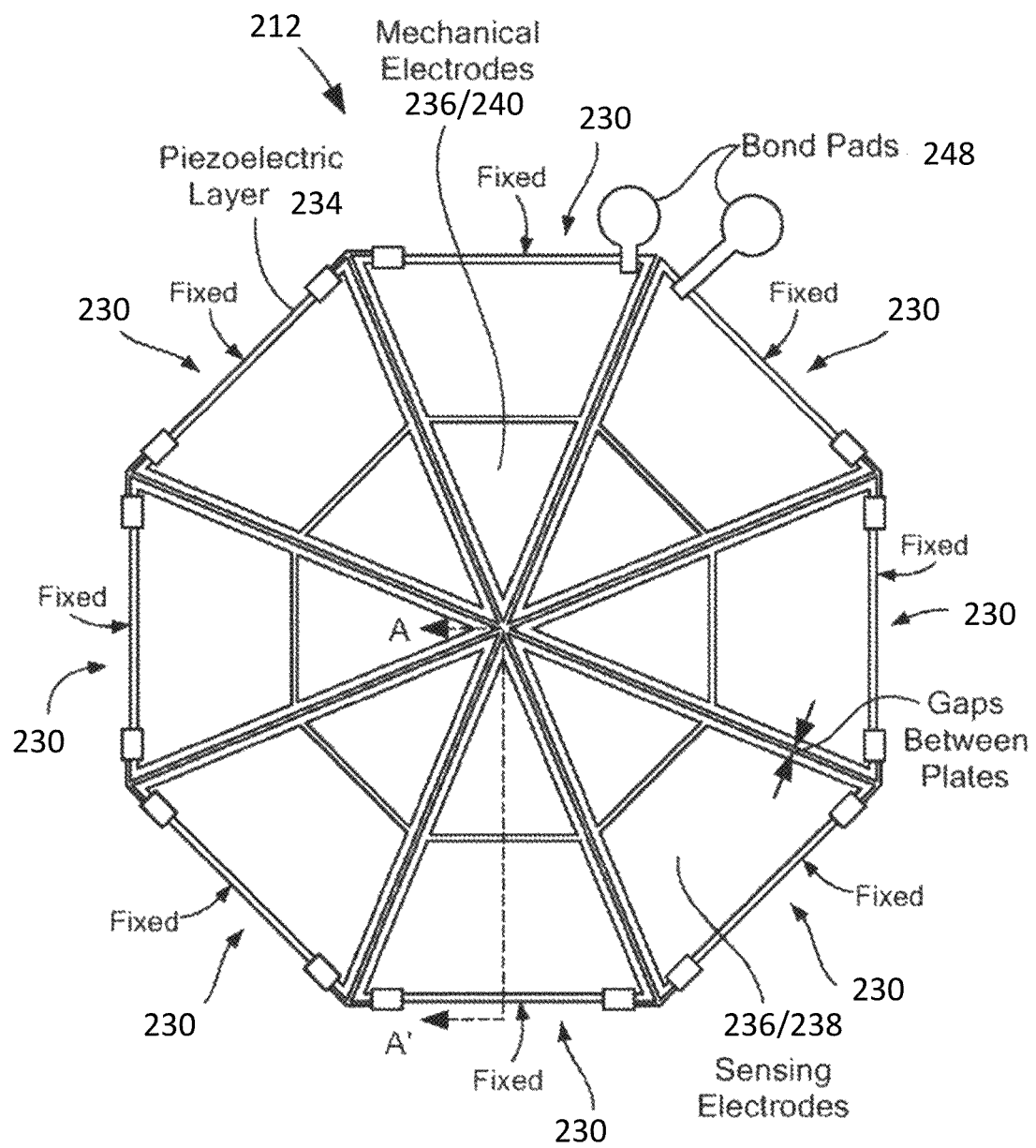
FIG. 2A schematically shows a plan view of a generic piezoelectric MEMS acoustic sensor die.
Figure 2B:
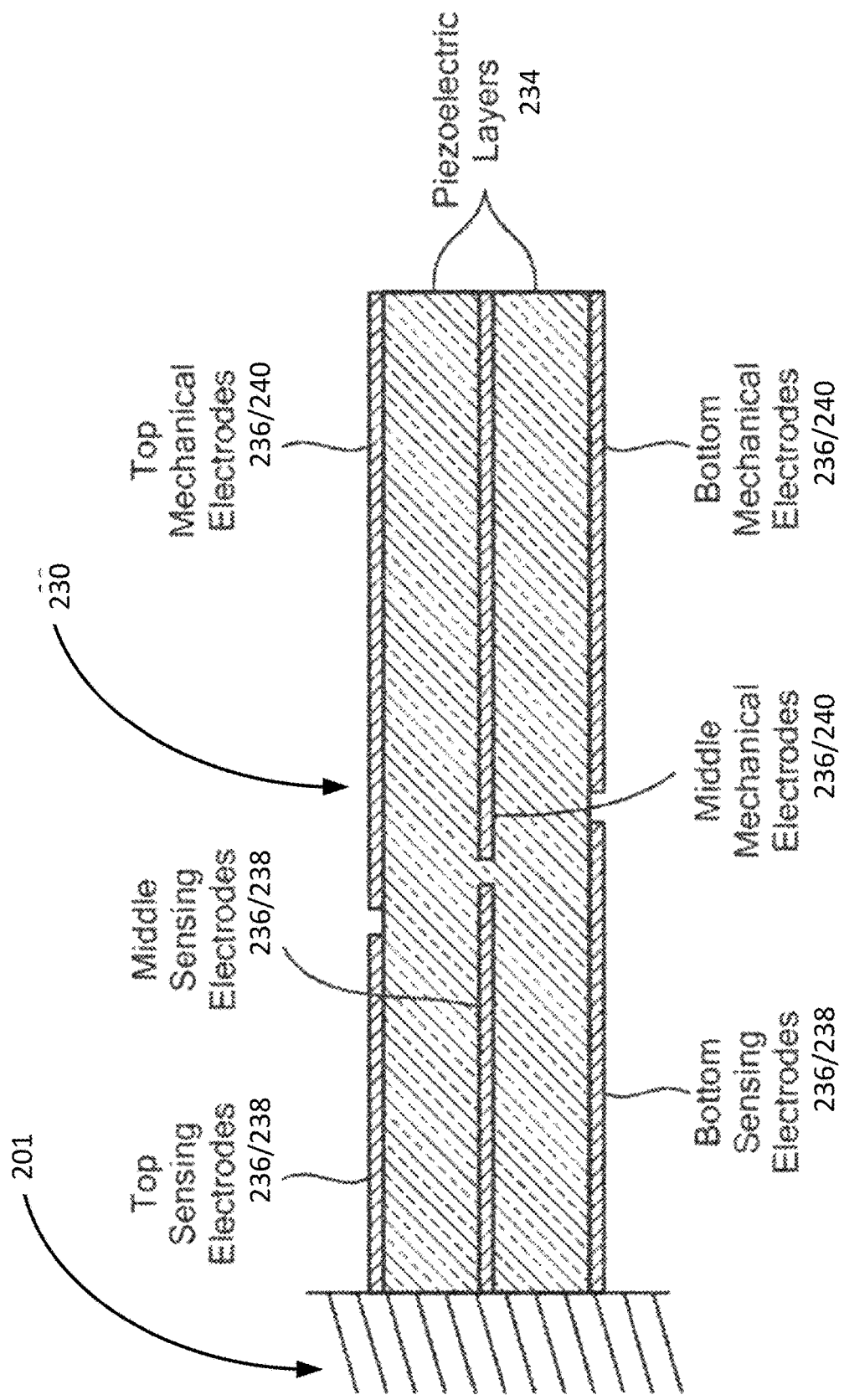
FIG. 2B schematically shows a cross-sectional view of a cantilever member of the MEMS acoustic sensor die across line A-A' of FIG. 2A.

FIG. 2A schematically shows a plan view of an exemplary microphone chip 212 using eight sense members (also known as "sense arms") formed as piezoelectric triangular cantilevers 230. These members together form an octagonal MEMS acoustic sensor. FIG. 2B shows a cross-sectional view of one of those cantilevers 230. Indeed, some embodiments may use more or fewer cantilevers 230. Accordingly, as with other features, discussion of eight cantilevers 230 is for illustrative purposes only. These triangular cantilevers 230 are fixed to a substrate 210 (e.g., a silicon substrate) at their respective bases and are configured to freely move in response to incoming/incident sound pressure (i.e., an acoustic wave). Triangular cantilevers 230 are preferable to rectangular ones as they form a gap controlling geometry. Specifically, when the cantilevers 230 bend up or down due to either sound pressure or residual stress, the gaps between adjacent cantilevers 230 typically remain relatively small.

The cantilever 230 can be fabricated by one or multiple layers of piezoelectric material sandwiched by top and bottom metal electrodes 236. FIG. 2B schematically shows an example of this structure. The piezoelectric layers 234 can be made by typical piezoelectric materials used in MEMS devices, such as one or more of aluminum nitride (AlN), aluminum scandium nitride (AlScN), zinc oxide (ZnO), and lead zirconate titanate (PZT). The electrodes 236 can be made by typical metal materials used in MEMS devices, such as one or more of molybdenum (Mo), platinum (Pi), nickel (Ni) and aluminum (Al). Alternatively, the electrodes 236 can be formed from a non-metal, such as doped polysilicon. These electrodes 236 can cover only a portion of the cantilever 230, e.g., from the base to about one third of the cantilever 230, as these areas generate electrical energy more efficiently within the piezoelectric layer 234 than the areas near the free end. Specifically, high stress concentration in these areas near the base induced by the incoming sound pressure is converted into electrical signal by direct piezoelectric effect.

The electrodes 236 are generally identified by reference number 236. However, the electrodes used to sense signal are referred to as "sensing electrodes" and are identified by reference number 238. These electrodes are preferably electrically connected in series to achieve the desired capacitance and sensitivity values. In addition to the sensing electrodes 238, the rest of the cantilever 230 also may be covered by metal to maintain certain mechanical strength of the structure. However, these "mechanical electrodes 40" do not contribute to the electrical signal of the microphone output.

Although the figures and this description discuss the piezoelectric MEMS acoustic sensor in great detail, those skilled in the art can apply various embodiments to other types of transducers. For example, various embodiments may apply to general inertial sensors, such as accelerometers and gyroscopes, pressure sensors, tilt sensors, speakers, chemical sensors, and/or ultrasonic transducers, condenser/capacitive microphones, and other types of sensors. Accordingly, detailed discussion of a piezoelectric MEMS acoustic sensor is primarily for illustrative purposes and not intended to limit various other embodiments of the invention.

Figure 3A:
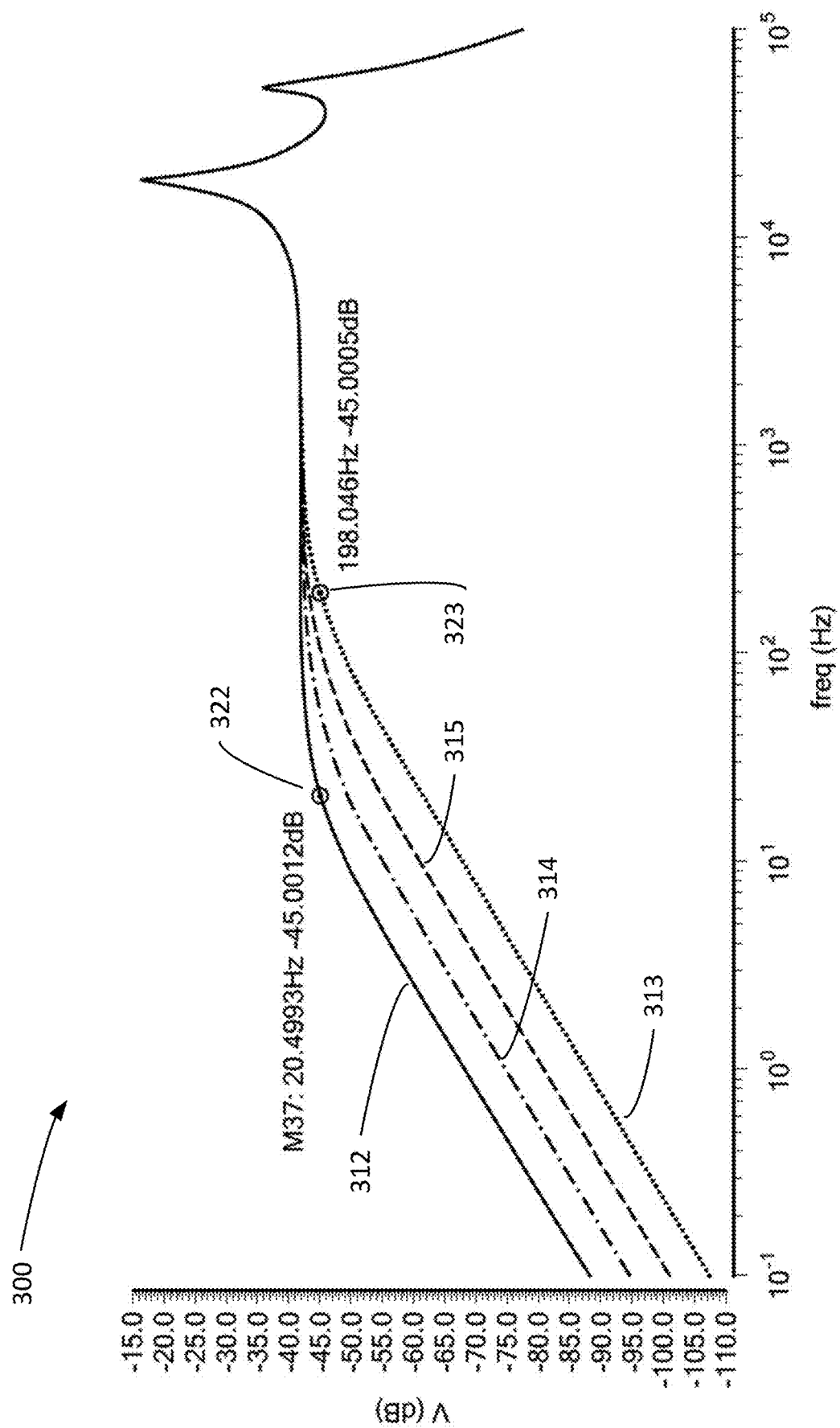
FIG. 3A schematically illustrates the frequency responses of embodiments of a MEMS microphone.
Figure 3B:
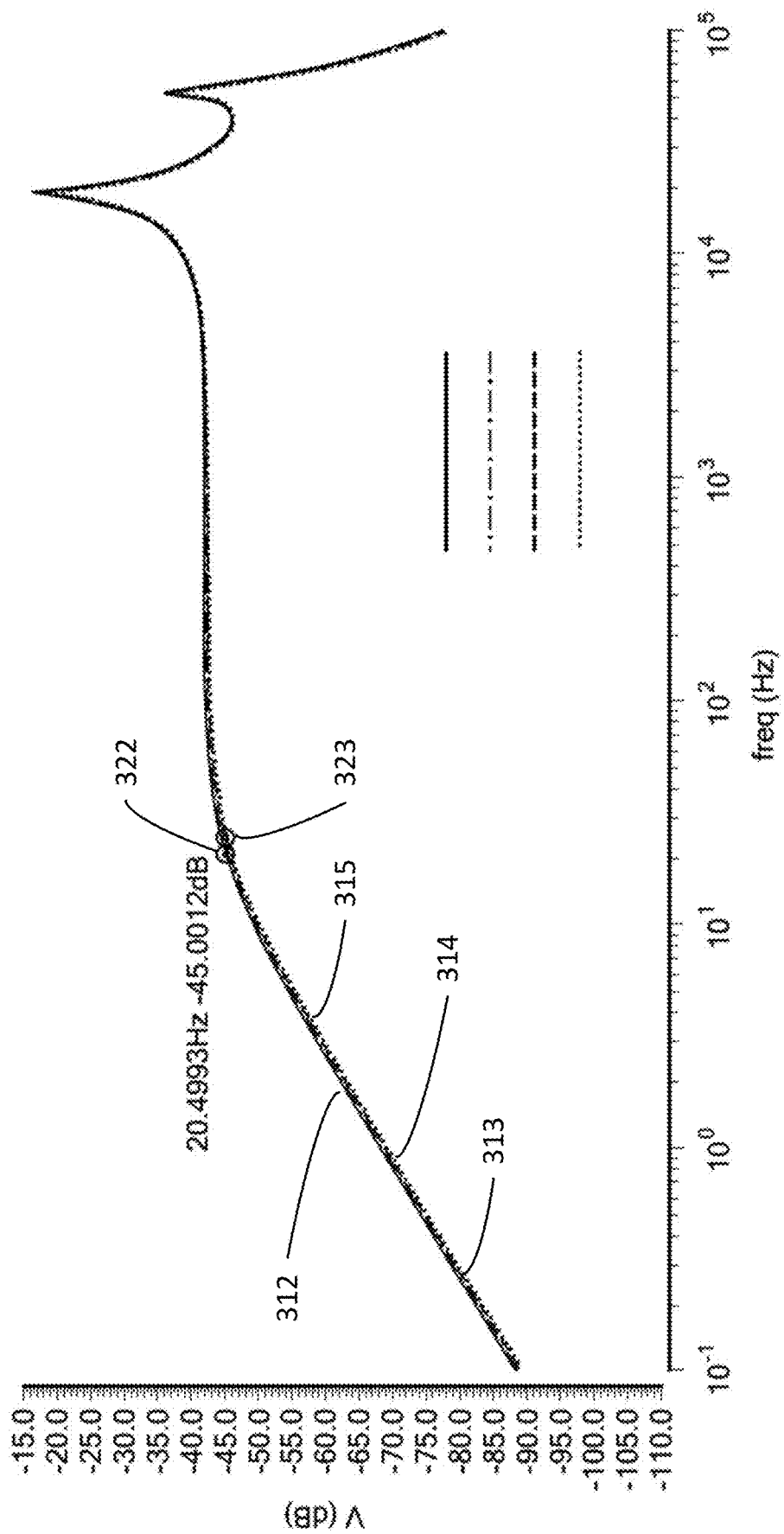
FIG. 3B schematically illustrates the frequency responses of the embodiments of a MEMS microphone according to illustrative embodiments.

FIG. 3A illustrates a frequency response for each of four transducers and FIG. 3B illustrates the frequency response for each of the same four transducers after trimming according to illustrative embodiments. Each of the transducers may be, for example, a transducer 212 as discussed above.

In these figures, the frequency response of a first transducer is illustrated by curve 312, the frequency response of a second transducer is illustrated by curve 313, the frequency response of a third transducer is illustrated by curve 314, and the frequency response of a fourth transducer is illustrated by curve 315. In some embodiments, the frequency responses shown in FIG. 3A are for open-loop transducers—i.e., transducers that do not have feedback into the transducer from the transducer's output (e.g., via amplifier 440 and one or more feedback networks).

Each transducer has a −3 dB point, as evidenced by a −3 dB point in its respective curve. For example, the first transducer has a −3 dB point 322 at 20.4993 Hz. The voltage amplitude of the transducer's output at that frequency is −45.0012 dB. As another example, the second transducer has a −3 dB point 323 at 198.046 Hz. Each of the other transducers also has a −3 dB point.

As shown, the frequency responses of the four transducers a deviate from one another, particularly at lower frequencies (i.e., in this embodiment, below 1,000 Hz), with the difference more pronounce the lower the frequency.

In some situations, such differences in frequency response may be undesirable or unacceptable. For example, a mobile phone manufacturer may desire that each microphone it uses has a substantially similar frequency response, so as to promote uniformity across its phones. As another example, some devices employ a set of two (or more) transducers, and may desire that each transducer in the set of transducers has a substantially similar frequency response.

To that end, illustrative embodiments include one or more transducer feedback networks that provide feedback to one or more transducers, to shift the −3 dB point of each such transducer. As described below, illustrative embodiments receive an output voltage from the transducer, and buffer or amplify the transducer output with an amplifier circuit. The output of the amplifier is provided to one or more feedback networks, one or more of which may be trimmable. Each feedback network produces a feedback signal, and provides that feedback signal as an input to the transducer.

Figure 5:
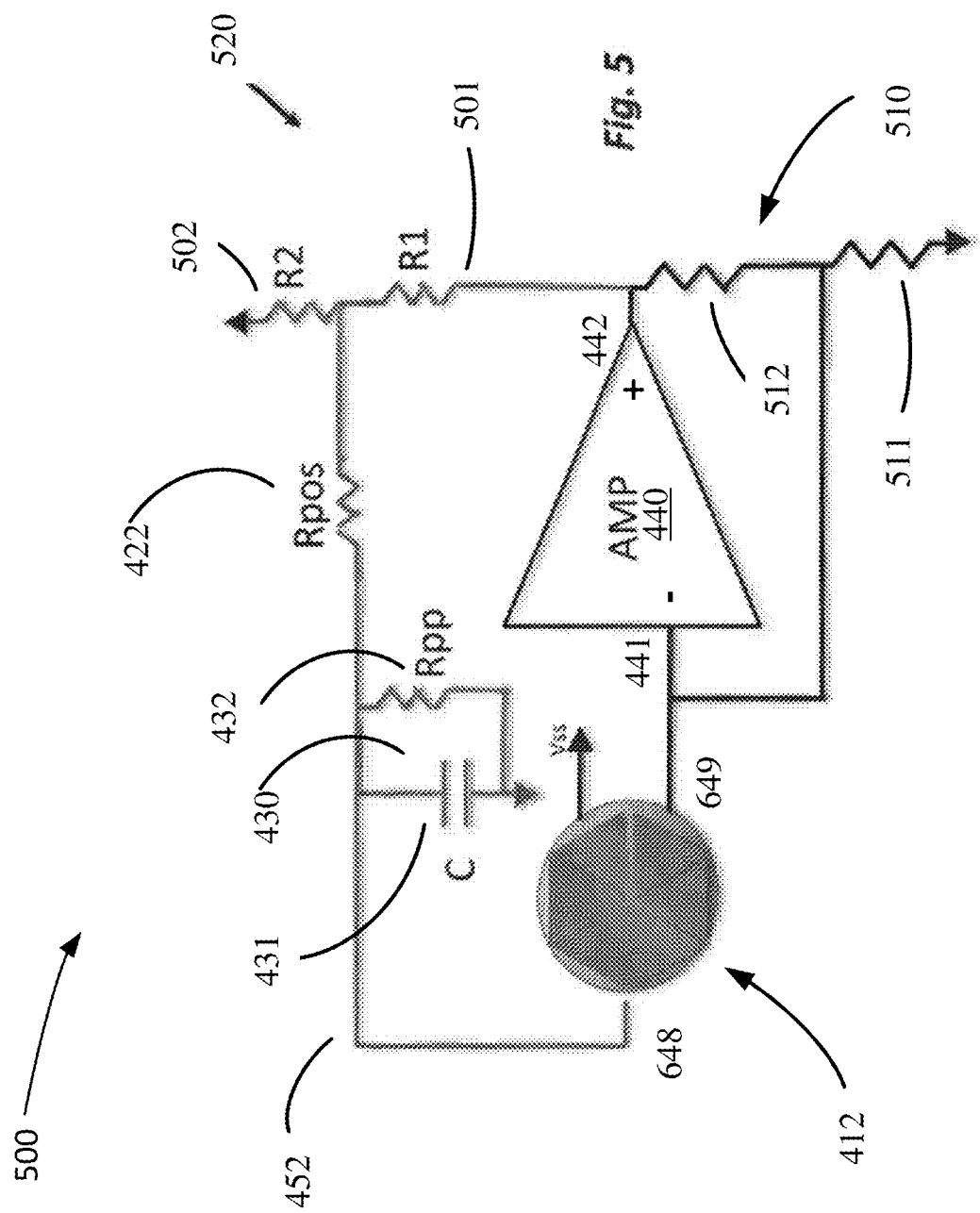
FIG. 5 schematically shows a circuit diagram of a MEMS acoustic sensor and circuitry to control the −3 dB point of the MEMS sensor in accordance with another embodiment of the invention (example of a single-ended embodiment)
Figure 6A:
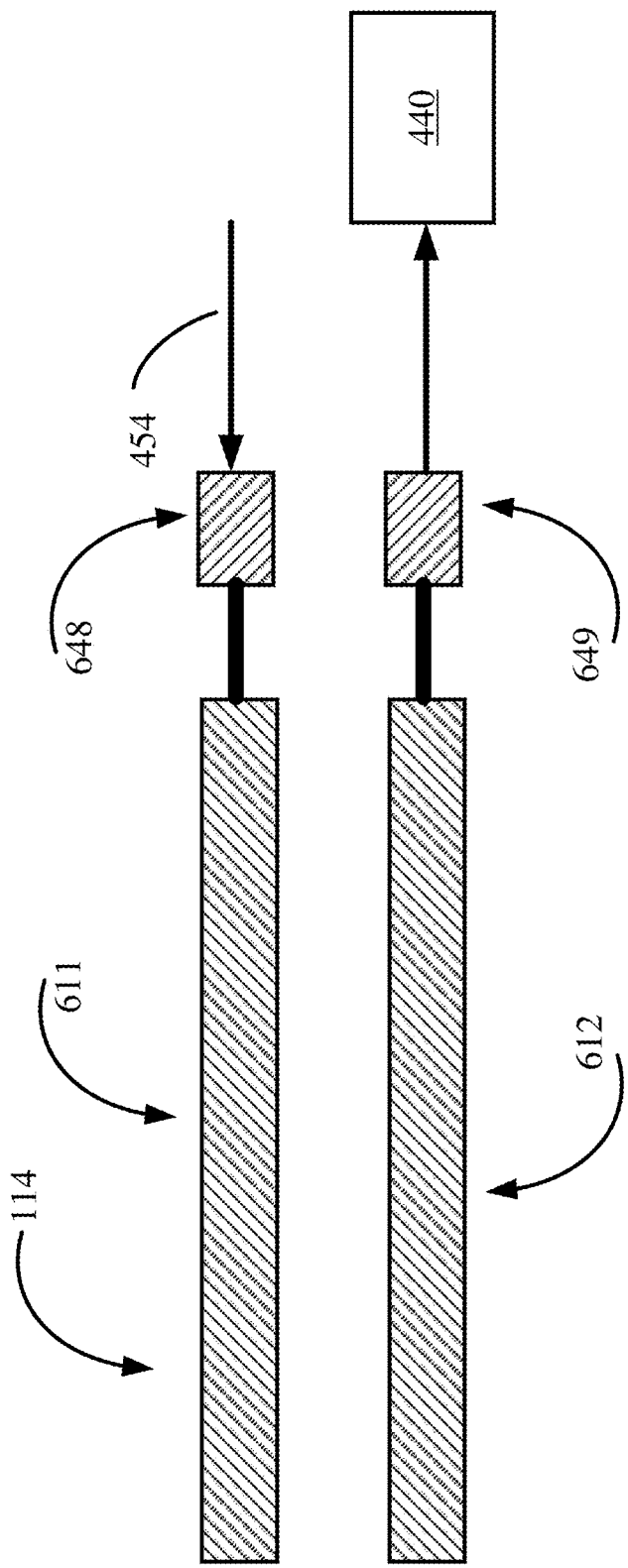
FIG. 6A schematically illustrates an embodiment of a MEMS transducer coupled to an amplifier and feedback circuit.

An illustrative embodiment of a feedback circuit coupled to, and providing a feedback signal to, a transducer 112 is schematically illustrated in FIG. 6A. In this embodiment, the transducer 112 may be a piezoelectric microphone, to name but one example, and the transducer 112 may be modeled as a capacitor having two plates 611 and 612. The feedback signal (whether a positive transducer feedback signal as in FIG. 5, or a negative transducer feedback signal, or a combined (e.g. summed) positive and negative feedback signal as in FIG. 4) is provided directly to one of the plate 611 via bond pad 648 (which may be one of the bond pads 248 shown in FIG. 2), while the transducer output is provided on another bond pad 689 (which may be a different one of the bond pads 248 shown in FIG. 2). The bond pad 648 may be considered to be an electrical input to the transducer 112.

Consequently, in such embodiments, the transducer is a circuit element (or circuit component) within the feedback circuit (in other words, the transducer is electrically disposed between an amplifier output 447 and an amplifier input, e.g., 441 and/or 443) and the feedback circuit may be referred-to as a "transducer" feedback circuit that produces a "transducer" feedback signal.

Moreover, the circuit is a linear circuit in that the amplifier produces a linear copy of the transducer's output. To that end, in illustrative embodiments, the amplifier is configured as a linear amplifier. For example, some embodiments include a feedback circuit between the amplifier's output and the amplifier's input, which may be referred-to as direct feedback circuit because that feedback circuit does not incorporate the transducer.

The feedback provided to a transducer urges a shift in that transducer's −3 dB point. For example, positive feedback urges the −3 dB point downward in frequency, and negative feedback urges the −3 dB point upward in frequency.

Turning to FIG. 3B, that figure shows that the frequency response curves 312, 313, 314 and 315 have converged, as a result of the application of feedback to the respective transducers. More specifically, curve 312 remains substantially unchanged (relative to curve 312 in FIG. 3A), but curve 313 has shifted lower in frequency so that it's −3 dB point 323 is not close to, and in some embodiments the same as, the −3 dB point 322 of curve 312 at 20.4993 Hz. Curves 314 and 315 have also shifted lower in frequency in response to transducer feedback applied to the corresponding transducers.

Figure 4:
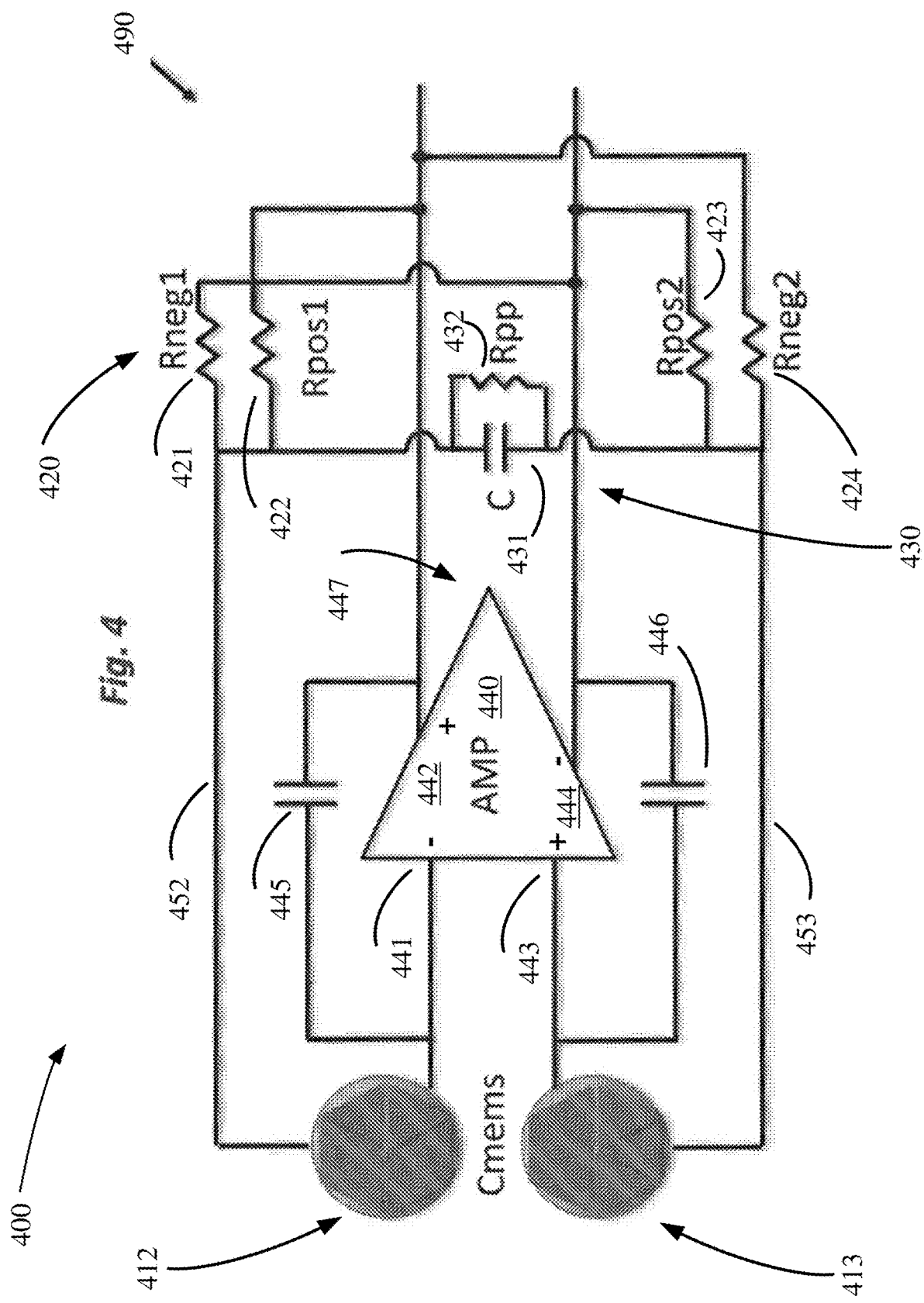
FIG. 4 schematically shows a circuit diagram of a MEMS acoustic sensor and circuitry to control the −3 dB point of the MEMS sensor in accordance with one embodiment of the invention (example of a differential embodiment).

FIG. 4 schematically shows a circuit diagram of a MEMS acoustic sensor and circuitry to control the −3 dB point of the MEMS sensor (also known as the "low frequency roll off point"). This −3 dB point control functionality preferably is implemented by the ASIC chip 116, although it may be implemented by circuitry located elsewhere, such as a separate die or on the MEMS chip 112. It also should be noted that although the widely used standard −3 dB point is discussed, those skilled in the art should understand that this −3 dB point can be above or below the precise −3 dB point, or can be a different value set for similar purposes. Accordingly, discussion of the −3 dB point is for illustrative purposes and not intended to limit all embodiments.

As shown, the system in this example includes two transducers implemented as MEMS chips 112 coupled with trimming circuitry 490. Among other things, the trimming circuitry 490 includes an amplifier 440 having an input coupled with the MEMS chips 112 and configured, in some embodiments, as an integrator with feedback capacitances. In preferred embodiments, the amplifier 440 is a differential analog front end ("AFE") amplifier, although other embodiments may use other types of amplifiers. As such, the amplifier 440 has one input 441 coupled with one of transducer 412 and the other input 443 coupled with the second transducer 413. In the embodiment of FIG. 4, input terminal 441 is the inverting input of amplifier 440, and input terminal 443 is the non-inverting input of amplifier 440.

The amplifier 440 has a differential output (447, including individual outputs 442; 444). In the embodiment of FIG. 4, output terminal 444 is the inverting output of amplifier 440, and output terminal 442 is the non-inverting output of amplifier 440. To control the −3 dB point, the transducer's output is used as input to a positive feedback loop directly coupling back to the two transducers 412, 413, and as input to a corresponding negative feedback loop directly coupling back to the two transducers 412, 413.

Specifically, the positive feedback loop has a first branch coupled with a first amplifier output terminal 442 and including a resistance Rpos1 422, and a second branch coupled with a second amplifier output terminal 444 and including a resistance Rpos2 423.

Note that resistances and capacitances discussed herein can be implemented in a number of manners, including as one or more resistors or resistances, single resistors, and/or as other devices, such as programmable non-volatile memory or controller 655. Accordingly, discussion of a "resistor" or "capacitor" may be considered to include one or more of such components or effective resistances and effective capacitances.

In a similar manner, the negative feedback loop has a first branch coupled with the second amplifier output terminal 444 and including a resistance Rneg1 421, and a second branch coupled with the first amplifier terminal 442 and including a resistance Rneg2 424. Each feedback network has a node 454 that couples to a transducer (e.g., 412, 413) to provide a feedback signal to that transducer. Each such node may be considered as the output point for its respective feedback network. For example, FIG. 4 illustrates two such nodes, numbered 452 and 453, providing a combined (positive and negative) feedback signal to transducers 412 and 413, respectively, and FIG. 5 has one such node, numbered 452, providing its feedback to transducer 412. In other words, such systems form a positive feedback signal and a negative feedback signal, and then sum summing the positive feedback signal with the negative feedback signal to form a combined feedback signal, and then forward forwarding the combined feedback signal to the transducer.

The system also has a filter 430 formed by capacitance C 431 and resistance Rpp 432.

Illustrative embodiments set the values of the circuit elements at a convenient point in the production process. For example, after a final test of the MEMS chips 112 (i.e., determining their respective −3 dB points), illustrative embodiments may calculate or otherwise determine the appropriate element values (e.g., via a lookup table), and then burn those values into programmable controller or memory 655 to trim the components.

The elements are selected so that the negative feedback loop causes the −3 dB point of the MEMS chip 112 to move in one direction, while the positive feedback loop causes the −3 dB point to move in an opposite direction. For example, the positive feedback loop may act as a coarse trim component by moving the −3 dB point to a lower frequency that is too low-effectively overshooting a more preferred −3 dB point. The negative feedback loop thus may act as a fine-tuning trim component by moving the −3 dB point upwardly, back to a more appropriate value from the initial overshot value. Other embodiments may use the negative and positive feedback loops in the opposite manner.

Figure 6B:
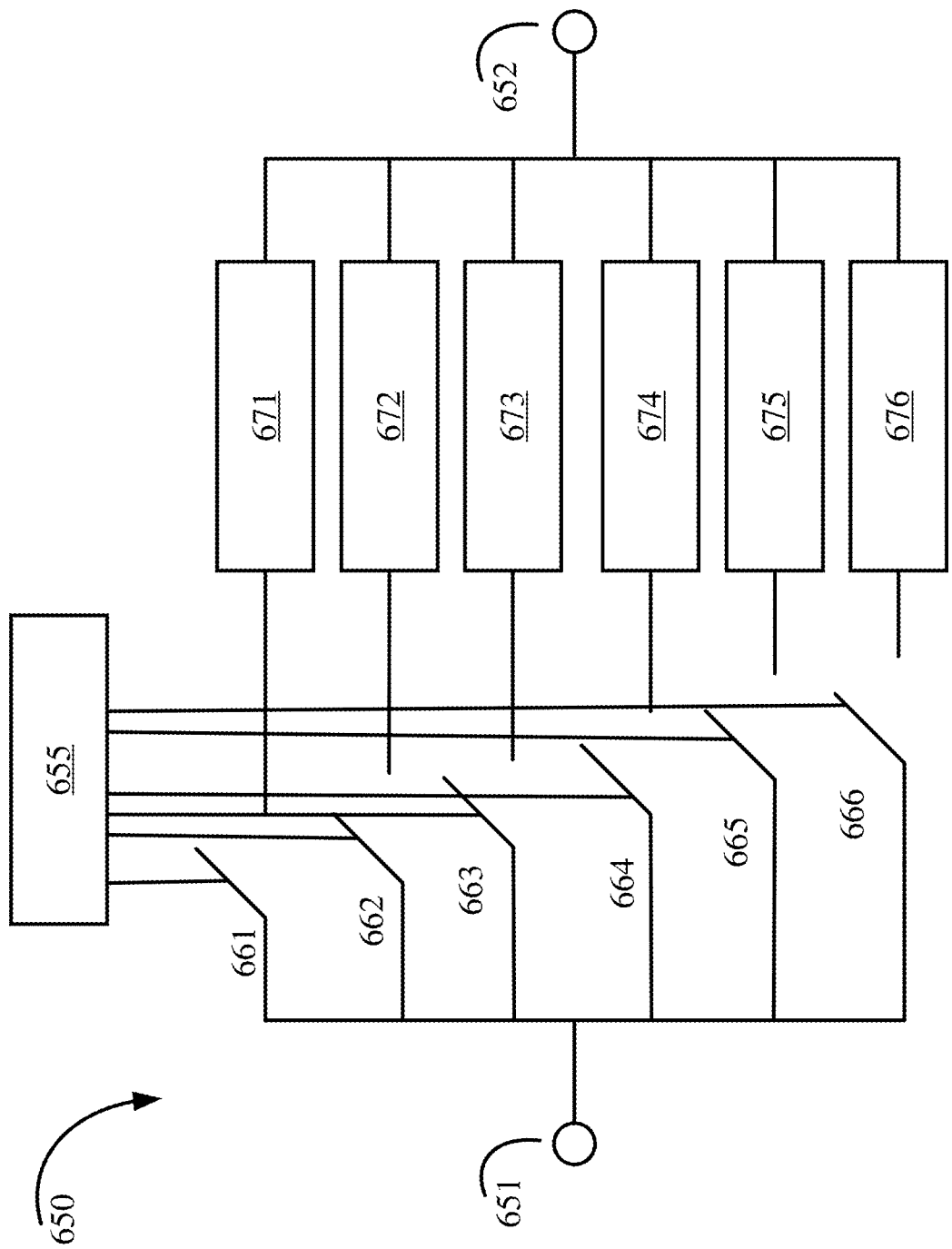
FIG. 6B schematically illustrates an embodiment of a controllable impedance.

In illustrative embodiments, any one or more of the resistors in the feedback networks (i.e., 421 and/or 422 and/or 423 and/or 424) may be programmable (or controllable, e.g., set and/or changed) in that their resistance may be electronically or digitally controlled. To that end, FIG. 6B schematically illustrates an embodiment of a controllable resistor 650 having two terminals 651 and 652. The controllable resistor 650 includes a set of resistors (in this embodiment, resistors 671, 672, 673, 674, 675 and 676) and a corresponding set of switches (in this embodiment, switches 661, 662, 663, 664, 665 and 666), as well as a control circuit 655. In illustrative embodiments, each switch may be a transistor such as a field effect transistor, or a MEMS switch, to name but a few examples. In illustrative embodiments, the controller 655 may be a memory or a microcontroller, to name but a few examples. The controller may be programmed. The controller 655 produces a set of outputs, one output each for each switch. In operation, each output has two states, and in a first state opens its corresponding switch to electrically disconnect its corresponding resistor from the terminals 651 and 652, and in a second state to electrically connect its corresponding resistor to the terminals 651 and 652. In this way, the resistance of the controllable resistor 650 may be controlled by programming of the controller 655.

Consequently, the electrical properties of each feedback network may be controlled and adjusted by operation of the controller 655.

The positive and negative feedback signals preferably produce two similar signals that are 180 degrees out of phase with each other. For example, the positive feedback signal may produce a signal that is generally in phase with the output signal of the MEMS chip 112. When applied, that in-phase signal positive feedback signal effectively raises the amplitude of the output signal of the MEMS chip 112, consequently reducing the frequency of the −3 dB point as noted above. Conversely, the negative feedback signal produces a signal that is generally 180 degrees out-of-phase with the output signal of the MEMS chip 112. When applied, that out-of-phase negative feedback signal effectively lowers the amplitude of the output signal of the MEMS chip 112, consequently increasing the −3 dB point as noted above.

In preferred embodiments, the −3 dB point is set to be within a range of 20 Hz to 40 Hz. Other embodiments may set the range to a smaller range, such as 20 Hz to 30 Hz. Note that this is the −3 dB point on the rising edge of the transfer function of the device—i.e., the low frequency −3 dB point.

Some embodiments do not require two MEMS transducers 212 or two feedback loops. For example, some embodiments may have just the positive feedback loop or just the negative feedback loop. FIG. 5 schematically shows one such example with one MEMS chip 112 and just a single positive trimmable feedback loop 520 (i.e., with one branch). This embodiment includes a single ended analog front-end amplifier 440 and the filter 430 including a capacitor C 431 and resistance Rpp 432. The circuit of FIG. 5 includes a direct feedback circuit 510 disposed between the amplifier output 442 and the amplifier input 441. In the embodiment of FIG. 5, input terminal 441 is the inverting input of amplifier 440, and output terminal 442 is the non-inverting output of amplifier 440.

Indeed, the two implementations of FIGS. 4 and 5 are but two of a variety of embodiments and thus, those skilled in the art may use other designs, such as using a single ended output amplifier with negative feedback only.

As such, illustrative embodiments electrically change the −3 dB point to enable use of MEMS chips 112 with less than desirable inherent −3 dB points. This favorably improves per wafer yield of MEMS chips 112, reducing per unit costs. Moreover, various embodiments enable use of MEMS transducer chips 112 in a wider variety of applications, such as applications that require a tight range for the −3 dB point.

As used herein, the term "negative prescribed resistance" or "negative resistance" refers to a resistance in a negative feedback circuit; and does not mean a resistance with a negative value (e.g., in ohms) or a circuit (e.g., a negative impedance converter) configured to provide a negative load.

A listing of certain reference numbers is presented below.
100: MEMS microphone
112: MEMS chip;
114: Piezoelectric structure;
116: ASIC chip;
118: Bond wire;
120: Package;
122: Printed circuit board ("PCB") substrate;
124: Acoustic port;
126: Solder pad;
128: Lid;
210: MEMS substrate;
230: Cantilevered piezoelectric segment;
234: Piezoelectric layer;
236: Mechanical electrode;
238: Sensing electrode;
240: Mechanical electrode;
248: Bond pad;
300: Frequency response graph;
400: Amplifier circuit;
412: First MEMS transducer;
413: Second MEMS transducer;
420: MEMS feedback network;
421: First MEMS feedback resistor;
422: Second MEMS feedback resistor;
423: Third MEMS feedback resistor;
424: Fourth MEMS feedback resistor;
430: Filter;
431: Filter capacitor;
432: Filter resistor;
440: Amplifier;
441: First amplifier input terminal;
442: First amplifier output terminal;
443: Second amplifier input terminal;
444: Second amplifier output terminal;
445: First amplifier feedback capacitor;
446: Second amplifier feedback capacitor;
447: Differential amplifier output;
452: Node;
453: Node;
454: Node
500: Amplifier circuit;
501: First trim resistor;
502: Second trim resistor;
510: Direct amplifier feedback network;
511: First amplifier feedback resistor;
512: Second amplifier feedback resistor;
520: Trim circuit;
611: First capacitor electrode;
616: Second capacitor electrode;
620: Amplifier and feedback circuitry;
648: Positive transducer electrode;
649: Negative transducer electrode;
650: Controllable impedance;
651: First controllable impedance terminal;
652: Second controllable impedance terminal;
655: Controller (e.g., memory);
661-666: Switches;
671-676: Switched impedances.

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A transducer system comprising:
a transducer configured to receive an incident signal and produce an output signal as a function of the incident signal, the output signal having a −3 dB point; and
circuitry operatively coupled with the transducer, the circuitry comprising an amplifier with an output configured to produce an amplified signal as a function of the output signal, the circuitry further having a positive feedback loop and a negative feedback loop, the positive and negative feedback loops electrically coupled between the transducer and the amplifier,
the positive feedback loop configured to move the −3 dB point in a first frequency direction,
the negative feedback loop configured to move the −3 dB point in a second frequency direction,
the first and second frequency directions being different.
P2. The transducer system of P1 wherein the circuitry further comprises a low pass filter configured to filter the amplified signal.
P3. The transducer system of any one or more of P1-P2 wherein the transducer comprises a MEMS microphone.
P4. The transducer system of any one or more of P1-P3 wherein the transducer comprises a piezoelectric MEMS microphone.
P5. The transducer system of any one or more of P1-P4 wherein the positive feedback loop comprises a positive prescribed resistance configured to reduce the −3 dB point.
P6. The transducer system of any one or more of P1-P5 wherein the negative feedback loop comprises a negative prescribed resistance configured to increase the −3 dB point.
P7. The transducer system of any one or more of P1-P6 wherein the positive feedback loop comprises two loops.
P8. The transducer system of any one or more of P1-P8 wherein the negative feedback loop comprises two loops.
P9. The transducer system of any one or more of P1-P8 wherein the first frequency direction reduces the frequency of the −3 dB point and the second frequency direction increases the frequency of the −3 dB point.
P10. The transducer system of any one or more of P1-P9 wherein the transducer produces the output signal as a function of the first feedback loop, the second feedback loop, or both the first and second feedback loops.
P11. The transducer system of any one or more of P1-P10 wherein the amplifier comprises an analog front-end controller ("AFE").
P12. The transducer system of any one or more of P1-P11 wherein the transducer comprises a transducer integrated circuit die.
P13. A method comprising:
receiving a transducer signal from a transducer integrated circuit die, the transducer signal having a −3 dB point;
amplifying the transducer signal to produce an amplified signal;
forming a feedback signal from the amplified signal;
forwarding the feedback signal to the transducer integrated circuit die; and
the transducer, in response to receipt of the feedback signal, moving the −3 dB point to a prescribed frequency range.
P14. The method of P13 wherein forming the feedback signal comprises forming a positive feedback signal and a negative feedback signal, forwarding comprising forwarding both the positive and negative feedback signals.
P15. The method of any or more of P14 wherein the positive feedback signal moves the −3 dB point in a lower frequency direction, the negative feedback signal moving the −3 dB point in a higher frequency direction by a different amount to the prescribed frequency range.
P16. The method of any or more of P13-P15 wherein forming the feedback signal comprises forming a positive feedback signal.
P17. The method of any or more of P13-P16 wherein comprising low pass filtering the amplified signal.
P18. The method of any or more of P13-P17 wherein the transducer integrated circuit die comprises a MEMS microphone.
P19. The method of any or more of P13-P18 wherein the transducer integrated circuit die comprises a piezoelectric MEMS microphone.
P20. The method of any or more of P13-P19 wherein the feedback signal is formed using a positive feedback loop comprising a positive prescribed resistance configured to reduce the −3 dB point of the transducer signal.
P21. The method of any or more of P13-P20 wherein the feedback signal is formed using a negative feedback loop comprising a negative prescribed resistance configured to increase the −3 dB point of the transducer signal.
P22. The method of P19 wherein the positive feedback loop comprises two loops.
P23. The method of P20 wherein the negative feedback loop comprises two loops.

The embodiments of the invention described above are intended to be merely exemplary; numerous variations and modifications will be apparent to those skilled in the art.

What is claimed is:

1. A transducer system comprising:
a first transducer having a transducer output, the first transducer configured to receive an incident signal and produce at the transducer output a first output signal as a function of the incident signal, the first transducer having a first −3 dB point; and
circuitry operatively coupled with the first transducer, the circuitry comprising an amplifier having an amplifier input in electrical communication with the transducer output, and an amplifier output configured to produce an amplified signal as a function of the first output signal, the circuitry further having a first positive feedback loop, the first positive feedback loop electrically coupled to the amplifier output and to the first transducer, to provide a first positive feedback signal to the first transducer;
the first positive feedback loop configured to move the first −3 dB point in a first frequency direction.

2. The transducer system of claim 1, wherein the first transducer is electrically disposed between the amplifier output and the amplifier input, such that the first transducer is an electrical component within the first positive feedback loop.

3. The transducer system of claim 1, wherein the amplifier is configured as a linear amplifier and the circuitry is electrically stable.

4. The transducer system of claim 1, further comprising:
a first negative feedback loop electrically coupled to the amplifier output and to the first transducer, to provide a negative feedback signal to the first transducer, the first negative feedback loop configured to move the first −3 dB point in a second frequency direction,
the first and second frequency directions being different.

5. The transducer system of claim 1, further comprising a low-pass filter in electrical communication with the first positive feedback loop to filter some frequencies from being provided as feedback voltage to the first transducer.

6. The transducer system of claim 1, further comprising amplifier feedback circuitry operably coupled between the amplifier output and the amplifier input to provide a direct feedback signal from the amplifier output and the amplifier input, the direct feedback signal not passing through the first transducer.

7. The transducer system of claim 1, wherein the first positive feedback loop includes a first programmable impedance, the first programmable impedance configured to controllably assume a plurality of impedance values to adjust an amplitude of the first positive feedback provided to the first transducer.

8. The transducer system of claim 7, wherein the first programmable impedance includes a plurality of resistors and a plurality of switches, each resistor of the plurality of resistors coupled to a corresponding switch; and the transducer system further comprises a programmable controller configured to provide a corresponding control signal to each switch of the plurality of switches.

9. The transducer system of claim 1, wherein the first frequency direction is a direction that moves the first −3 dB point lower in frequency.

10. The transducer system of claim 4, wherein the second frequency direction is a direction that moves the first −3 dB point higher in frequency.

11. The transducer system of claim 1 wherein the amplifier is configured as a linear amplifier, and the transducer system further comprises:
 a second transducer distinct from the first transducer and configured to receive the incident signal, the second transducer having a second −3 dB point, the second transducer operably coupled to the amplifier input;
 the circuitry further having a second positive feedback loop, the second positive feedback loop electrically coupled to the amplifier output and to the second transducer, to provide a second positive feedback signal from the amplifier output to the second transducer;
 the second positive feedback loop configured to move the second −3 dB point in the first frequency direction.

12. A method comprising:
 receiving a transducer signal from a micromachined transducer, the transducer signal having a −3 dB point at a given frequency;
 amplifying the transducer signal to produce an amplified signal;
 forming a feedback signal from the amplified signal; and
 forwarding the feedback signal to the micromachined transducer, the micromachined transducer, in response to receipt of the feedback signal, moving the −3 dB point to a prescribed frequency range.

13. The method of claim 12 wherein forming the feedback signal comprises forming a positive feedback signal, and forwarding the positive feedback signal to the micromachined transducer moves the −3 dB point in a lower frequency direction.

14. The method of claim 12 wherein forming the feedback signal comprises forming a positive feedback signal and a negative feedback signal, forwarding comprising forwarding both the positive and negative feedback signals to the micromachined transducer.

15. The method of claim 14, wherein the positive feedback signal moves the −3 dB point in a lower frequency direction, the negative feedback signal moves the −3 dB point in a higher frequency direction by a different amount.

16. A transducer system comprising:
 a first transducer configured to receive an incident signal and produce a first output signal as a function of the incident signal, the first transducer having a first −3 dB point at a given frequency;
 means for producing a first positive feedback signal from the first output signal; and
 means for providing the first positive feedback signal as a positive feedback input to the first transducer, the first positive feedback input configured to move the first −3 dB point in a negative frequency direction.

17. The transducer system of claim 16, wherein the means for producing a first positive feedback signal from the first output signal comprises an amplifier configured as a linear amplifier.

18. The transducer system of claim 17, wherein the first transducer is electrically disposed between an output of the amplifier and an input of the amplifier, such that the first transducer is an electrical component within the means for producing a first positive feedback signal.

19. The transducer system of claim 17, further comprising:
 a first negative feedback loop electrically coupled between an output of the amplifier and the first transducer, to provide a negative feedback signal to the first transducer, the first negative feedback loop configured to move the −3 dB point in a positive frequency direction.

20. The transducer system of claim 16, wherein the means for providing the first positive feedback signal as a positive feedback input to the first transducer further comprises a low-pass filter means positive feedback loop to filter frequencies from being provided as feedback voltage to the first transducer.

* * * * *